United States Patent [19]

Bray

[11] Patent Number: 4,727,581

[45] Date of Patent: Feb. 23, 1988

[54] METHOD AND APPARATUS FOR INCREASING PERCEIVED REVERBERANT FIELD DIFFUSION

[75] Inventor: Wade R. Bray, Seymour, Conn.

[73] Assignee: Acoustic Angels Corporation, Norwalk, Conn.

[21] Appl. No.: 853,002

[22] Filed: Apr. 17, 1986

[51] Int. Cl.⁴ .............................................. H03G 3/00

[52] U.S. Cl. ........................................ 351/63; 351/62; 84/DIG. 26

[58] Field of Search .................. 84/DIG. 4, DIG. 26; 351/62, 63

[56] References Cited

U.S. PATENT DOCUMENTS

| | | | |
|---|---|---|---|
| 3,157,725 | 11/1964 | Wayne | 84/DIG. 26 |
| 3,535,453 | 10/1970 | Veneklasen | 179/1 |
| 4,205,579 | 6/1980 | Kakehashi | 84/DIG. 4 |
| 4,472,834 | 9/1984 | Yamamuro et al. | 381/63 |
| 4,509,191 | 4/1985 | Miller | 381/63 |
| 4,584,701 | 4/1986 | Nakama et al. | 381/63 |

OTHER PUBLICATIONS

Guelke and Broadhurst, "Reverberation Time Control by Direct Feedback", *Acustica,* vol. 24, pp. 33–41, (1971).

Guelke, "Assisted Reverberation in an Outdoor Environment", Acustica, vol. 30, pp. 335–337.

Towne, Richards & Chaundiere, Inc., "Sound System", McMinnville, 9/1981.

*Primary Examiner*—Forester W. Isen

*Attorney, Agent, or Firm*—Morgan & Finnegan

[57] ABSTRACT

A method and apparatus for increasing perceived reverberant field diffusion in systems providing electroacoustic reverberant enhancement to rooms or spaces includes independent modulation of the phase of each individual release loudspeaker channel in response to an effectively random infrasonic modulating signal, independently developed for each channel. Each loudspeaker release channel is fed from an electronic reverberator. The release channel signals are timed to emerge into the room at different times. The amplitude of each channel may also be modulated. In one embodiment, independent devices for generating infrasonic modulating signals have the characteristics of at least two frequencies being present within the range of about five seconds/cycle to about five cycles/second, for supplying control signals for achieving modulation in phase and amplitude.

28 Claims, 10 Drawing Figures

METHOD AND APPARATUS FOR INCREASING PERCEIVED REVERBERANT FIELD DIFFUSION

BACKGROUND OF THE INVENTION

The invention pertains to electro-acoustical systems and more particularly to electro-acoustical systems for providing reverberant enhancement to rooms or spaces.

As is well-known in the acoustical art, a natural reverberant field, developing within a room, is characterized by diffusion, phase randomness and slight variations in amplitude at any point within the room during the decay of the reverberant field. The perception to a listener of such a naturally reverberant field is of being surrounded by an amorphous, directionless field of sound which decays in such a way as to include subtle sensations of animation and space.

A wide variety of methods are known for augmenting room acoustic reverberation by the use of electronic devices. Such electronic augmentation systems typically provide various types of delay lines, reverberation devices, and sound chambers. Multi-channel systems employing positive feedback for providing reverberation augmentation are also known.

However, with all prior known systems for electronically developing reverberation to enhance the reverberance of rooms, there have been shortcomings. For example, the perception of reverberance diffusion is often difficult to achieve with a necessarily limited number of loudspeakers, in comparison to the diffusion created by an extremely large number of virtual sources such as occurs in a natural reverberant field. The large number of virtual sources in a naturally occurring reverberant field is due to reflections from every direction.

Furthermore, in prior known electro-acoustical systems providing reverberation, the perceived quality of the reverberation is relatively unnatural. In such prior art systems, there is a perceived sense of insufficiency and a change of tonal quality as the natural field dissipates and the electronically augmented field continues. This sense of insufficiency is apparently caused by irregular frequency response, sensitivity to room modes, lack of enough perceived directionlessness, and lack of subtle animation effects that characterize the decay in the aforementioned natural reverberant fields.

In such known electro-acoustical systems, there has also been a tendency for the electronically enhanced reverberation to be overly sensitive to room modes, i.e., the reverberation tended to develop to an excessive degree in response to some tones sounded in a room and to develop to an insufficient degree in response to other tones. For example, this effect is particularly elicited by the pure tones of an instrument such as a pipe organ. As a direct result of such sensitivity, microphone placement can be extremely difficult and impractically critical.

Due partially to the aforementioned sensitivity to room modes and the attendant progressive disruption of the amplitude versus frequency response of the augmented reverberation into an array of steep hills and valleys, it has proven in the past to be difficult to develop both believable tonal quality and adequate level in electronically augmented reverberant fields.

The electronic tools of various electro-acoustical systems, particularly as applied to musical instruments, are well known. Reverberation devices, delay lines, and amplitude and phase modulators have all been applied in recording studio signal processing systems for making sound recordings. Such devices have also been applied in electronic organs and other electronic musical instruments. The hardware for such implementations is commonplace.

It has also been known in past electro-acoustical systems to provide phase modulation to direct positive acoustic feedback reverberation-extension units. For example, Guelke and Broadhurst describe, in "Reverberation Time Control by Direct Feedback", *Acustica* Vol. 24 (1971) at pages 33–41, phase modulation being applied to direct electro-acoustic feedback in order to increase the gain before feedback of a concert hall reverberation-extension system. In "Assisted Reverberation in an Outdoor Environment", *Acustica* Vol. 38 (1977) pages 335–337, Mr. Guelke describes a two-channel reverberation system at an outdoor concert location where phase modulation is applied. The stated goal of applying phase modulation in each of these papers was to increase level before the onset of instability. In the Guelke systems, phase modulation was applied in only one channel. Another known electro-acoustical system utilizing a reverberation chamber and a delay device for providing relative variation in magnitudes of the delayed energy increments in advance of the reverberation is described in U.S. Pat. No. 3,535,453, issued to Veneklasen (1970).

However, it has not heretofore been known to provide an electro-acoustical reverberance enhancement system which results in an increased sense of naturalness, directionlessness and animation through random phase variation between output and input. It has further not heretofore been known to provide such a system which may be adapted to function with a large number of channels and loudspeakers. It has further not heretofore been known to provide an electro-acoustical system for providing enhanced reverberation which has not been overly sensitive to room modes.

It is therefore an object of the invention to provide a method and apparatus for enhancing the diffusion of electro-acoustically developed reverberance.

It is a further object of the invention to provide a method and apparatus for enhancing reverberance diffusion which is not dependent upon a large number of loudspeakers.

It is a further object of the invention to provide an electro-acoustical reverberance enhancement system which provides an increased sense of naturalness, directionlessness and animation, which is not overly sensitive to room modes and which provides for facilitated microphone placement.

SUMMARY OF THE INVENTION

These and other objects of the invention are met by providing an electro-acoustic reverberant enhancement apparatus and method including phase modulating means incorporated into each loudspeaker release channel fed from a reverberator. The invention provides independent modulation of the phase of each individual release loudspeaker channel fed from a reverberator, and optionally separately the amplitude of each such channel, in response to effectively random infrasonic modulating signals independently developed for each channel. In addition to employing modulation techniques, the release channel signals emerge at different times. A plurality of independent infrasonic generating means generates plural infrasonic modulating control signals of specific waveforms having the characteristic of at least two frequencies being present within the range of about five seconds/cycle to about five cycles/-second. The invention provides an increased sense of naturalness, directionlessness and animation by imitating these effects characteristic of a naturally-occurring reverberant field through phase and amplitude modulation producing, continuously changing phase differentials from any release channel to any other release channel, and from the aggregate of the release channels to the reverberation channel or channels.

Phase randomness, perceived diffusion, directionlessness, and subtle animation are developed to enliven and naturalize the character of the electronically-augmented reverberant field within the room, by means of independent modulation of a finite number of loudspeaker release channels positioned to approximate omnidirectionality. Benefits directly related to the invention include a greater sense of omnidirectionality and a lack of localization of release channel loudspeakers, the ability of a relatively small number of release loudspeaker channels to imitate a very large number of virtual sources, and the introduction of subtle "animation" effects which accompany the decay of a natural reverberant field.

BRIEF DESCRIPTION OF THE DRAWINGS

The invention will be described in greater detail below by way of reference to the following drawings, in which.

DETAILED DESCRIPTION OF THE DRAWINGS

Several embodiments of the invention will be described hereinafter with reference to the drawings of FIG. 1–10.

Figure 1:
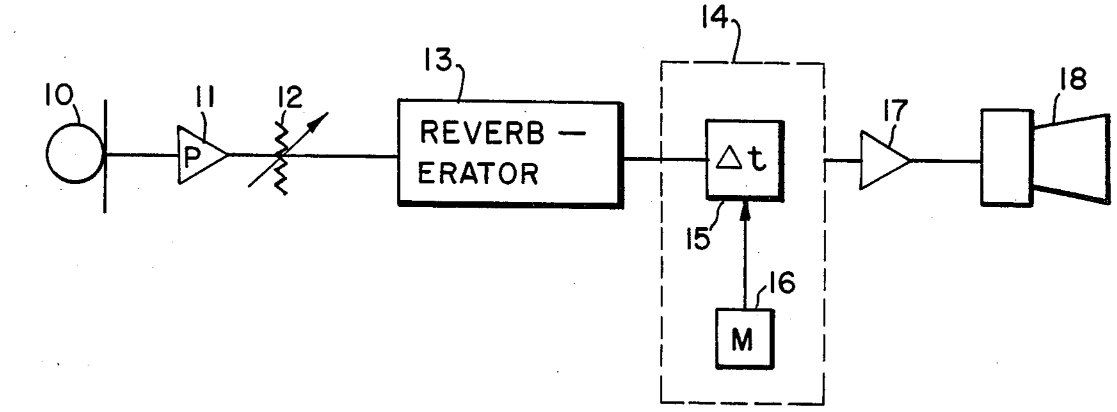
FIG. 1 is a schematic illustration of a first embodiment to the invention providing phase variation of output reverberation.

FIG. 1 illustrates a first embodiment of the invention including a phase modulation unit 14 including a signal delay device 15 and an infrasonic modulation source 16. Also illustrated in FIG. 1 are a microphone 10, a microphone pre-amplifier 11, a variable level control 12, and a reverberator 13 which, although not limited to any particular reverberation device, may be an Industrial Research Products Inc. XD-1180-series Reverberation Device. Amplifier 17 and loudspeaker 18 are also illustrated in FIG. 1.

In overview, the functioning of the embodiment of FIG. 1 is as follows. Microphone 10 is provided to pick-up environmental sound but may be replaced with a variety of audio inputs. The pre-amplifier 11 and variable level control 12 provide standard functions of increasing and adjusting signal level. Signal reverberation is provided at reverberator 13. The phase of the reverberated signal is then modulated infrasonically at phase modulator unit 14 and the resultant modulated signal is amplified 17 and released through, for example, a loudspeaker 18.

Figure 10:
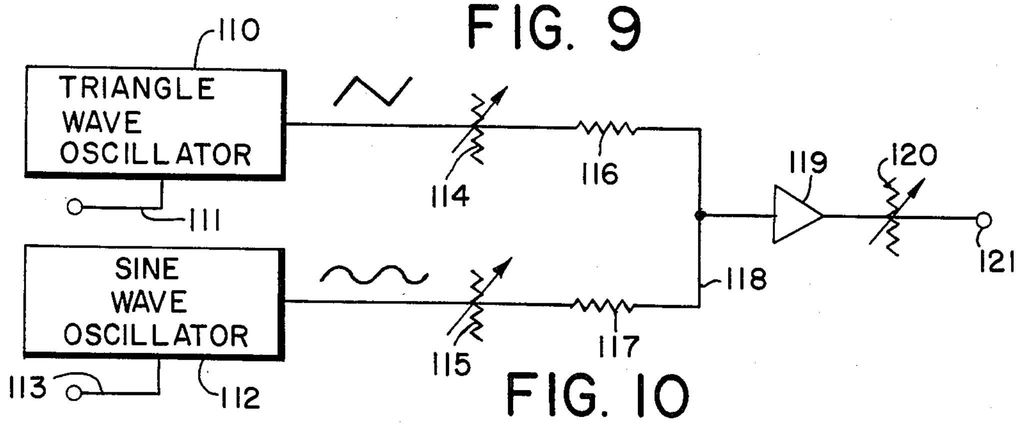
FIG. 10 is a schematic illustration of an infrasonic modulation circuit which may be provided as an infrasonic modulation source in the various embodiments of the invention.

The infrasonic modulation source 16 of phase modulation unit 14 may be a control voltage source. One such control voltage source, comprising two oscillators, is illustrated in the diagram of FIG. 10. Note, however, that a wide variety of infrasonic modulation sources may be provided within the invention. FIG. 10 illustrates a first oscillator 110 which may be a triangle wave oscillator having a frequency control 111, and a second oscillator 112 which may be a sine-wave oscillator having a frequency control 113. The outputs of the triangle wave oscillator 110 and the sine-wave oscillator 112, passing independently through variable level controls 114, 115 and resistances 116, 117, may be mixed via a bus 118 before passing through a mixing amplifier 119, the output of which may pass through a variable level control 120 and through output 121. The output 121 of the infrasonic modulation source of FIG. 10 may be provided to the signal delay device 15 of the embodiment of FIG. 1 for varying the clock frequency of the signal delay device 15. Varying the clock signal in this manner results in effectively random shifting of the time of release of the modulated signals and thereby results in a phase shift. Preferably, the amount of the phase shift will be enough to obtain the desired effect but not enough to change the pitch of the resultant signal. An effective percentage of phase shift may be determined empirically according to the natural accoustics of the space where the system is embodied.

FIG. 1 illustrates employing independent modulation of the phase of each individual loudspeaker channel in response to an effectively random infrasonic modulating signal independently developed for the channel in accordance with the invention. With the electro-acoustical reverberation enhancement system according to FIG. 1, the above-stated objects of the invention, including an increased sense of naturalness, directionlessness and animation, may be achieved.

Figure 2:
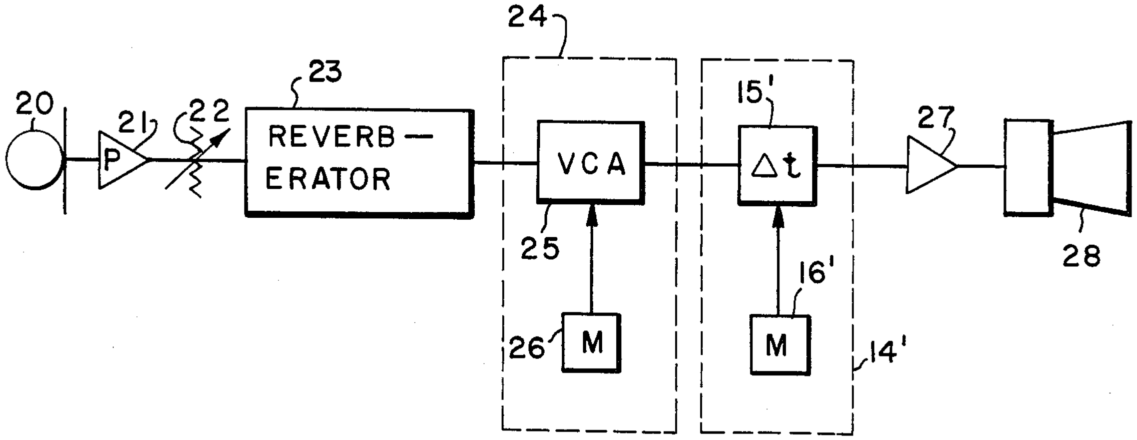
FIG. 2 is a schematic illustration of a further embodiment of the invention providing both phase and amplitude variation of output reverberation.

FIG. 2 illustrates both phase and amplitude variation of output reverberation in accordance with a further embodiment of the invention. As in FIG. 1, the embodiment of FIG. 2 is shown for a single channel. In FIG. 2, items 20–23, 27–28 correspond to items 10–13, 17–18 of FIG. 1. Further illustrated in FIG. 2, as receiving an input from reverberator 23, is an amplitude modulation unit 24 including an infrasonic modulation source 26 and an amplitude affecting device such as a voltage control amplifier 25 whose control voltage is derived from the random or pseudo-random variable voltage infrasonic modulation source 26. As with the phase modulation unit 14 of FIG. 1, the infrasonic modulation source 26 of the amplitude modulation unit 24 of the embodiment of FIG. 2 may comprise the two-oscillator circuit of FIG. 10. Also illustrated in FIG. 2 is a phase modulation unit 14′ comprising signal delay device 15′ and infrasonic modulation device 16′. The functioning of the phase modulation unit 14′ of FIG. 2 is similar to the functioning phase modulation unit 14 described above with regards to FIG. 1. Thus, the embodiment of FIG. 2 functions as the embodiment of FIG. 1 with the additional function of amplitude modulation being provided by the embodiment of FIG. 2.

Although amplitude modulation unit 24 and phase modulation unit 14′ are illustrated in FIG. 2 downstream from reverberator 23 the order of appearance of the phase modulation and amplitude modulation units may be switched and the units may logically be provided anywhere along the series of the basic channels illustrated in FIGS. 1 and 2 as long as system functioning is not impeded.

It is currently preferred that embodiments of the invention provide an independent infrasonic modulation source for each voltage control amplifier or signal delay device to be modulated. Additionally, in preferred embodiments, the modulating signal will occupy a frequency band from about five seconds per cycle to about five cycles per second and have components defining that range. Furthermore, the longest-wave length components (lowest frequency) of the modulating signal will ordinarily have the highest amplitudes.

In other embodiments of the invention, the modulating signal may be, for example, low-pass filtered random noise or a combination of cyclic wave-forms. One simple combination of such cyclic wave-forms appears to be a combination of a triangle wave of higher amplitude having a frequency in the range of 0.2 Hz–1 Hz and a sinusoid of lower amplitude having a frequency in the range of 2 Hz–5 Hz. A device for generating such a combination is illustrated by way of reference to FIG. 10. Preferably, at least two release channels with independent modulation sources will be used in order to avoid perception of the components of the modulating wave-forms. Provided that at least two independent modulation sources are used, some simplifications to the system are possible. For example, an infrasonic modulation source may be equipped such as in FIG. 6 with non-inverting and inverting outputs (i.e., the same signal but 180° out of phase). Preferably, loudspeaker channels modulated by such inverted/non-inverted signals should not be adjacent. A further simplification may be made such that an infrasonic modulation source may modulate the phase of one channel and the amplitude of another channel.

Figure 3:
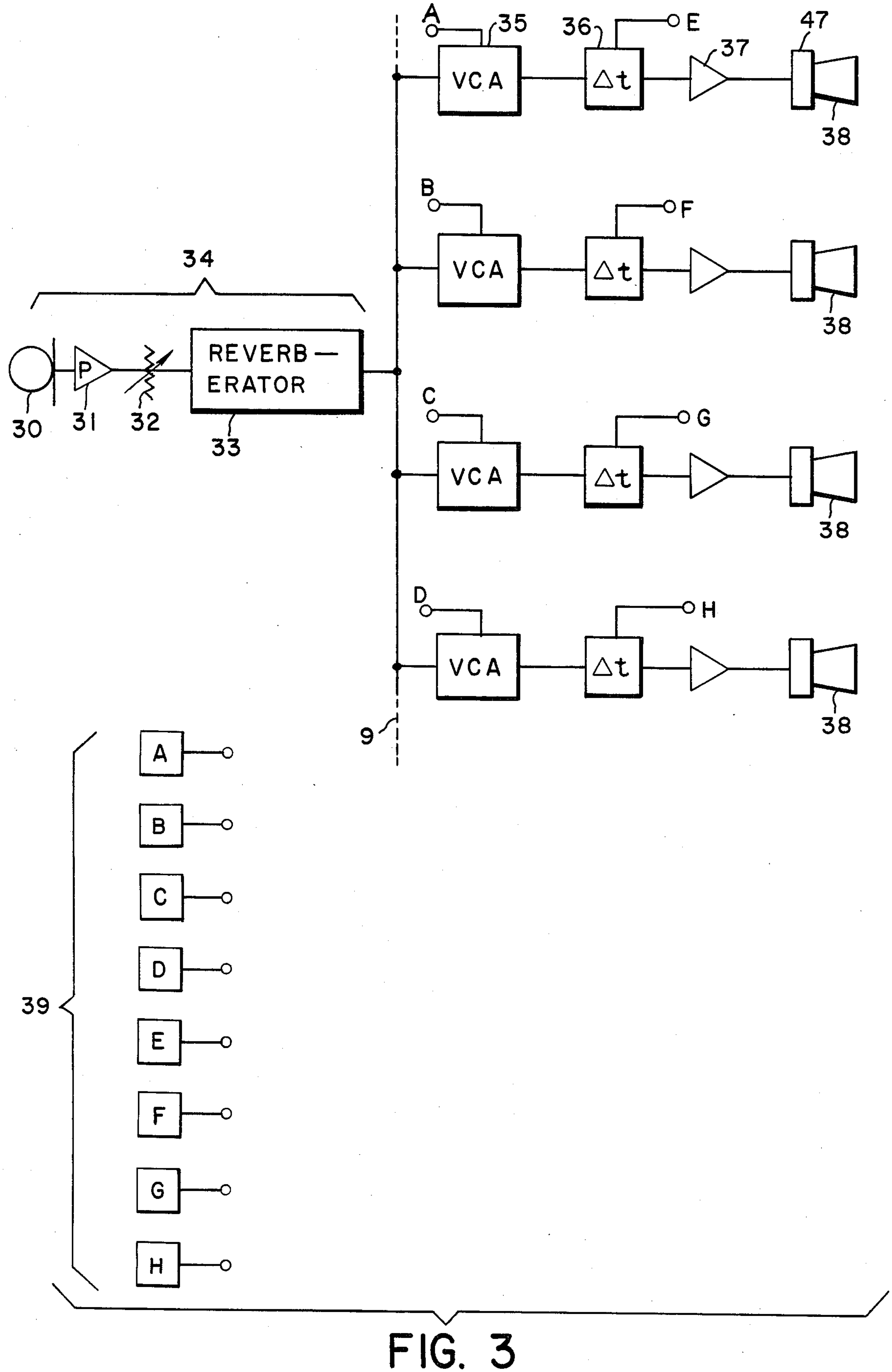
FIG. 3 is a schematic illustration illustrating the expandability of a system in an embodiment of the invention including a single reverberator and multiple outputs.

With the basic channel structures of the invention (FIGS. 1–2) in mind, various expanded system versions of the invention, comprising multiple release channels, will be described by way of reference to FIGS. 3–9. FIG. 3 illustrates a first expanded system according to the invention comprising a single reverberator 33 and multiple outputs 38. Items 30–33 correspond to items 10–13 of FIG. 1 and form a reverberation channel 34. A plurality of release channels 38 shown in FIG. 3 each comprise an amplitude modulating unit including a voltage control amplifier 35, a phase modulation unit including a signal delay device 36, an amplifier 37 and a release loudspeaker 47. Reverberation channel 34 is coupled to system bus 9. Bus 9 distributes the input signal from the reverberation channel 34 to each of the output channels 38. A plurality 39 of infrasonic modulation sources A–H are shown in FIG. 3. Such infrasonic modulation sources A–H, which may comprise the circuit of FIG. 10, independently provide random or pseudo-random control voltages, one each for the plurality of voltage control amplifiers 35 and signal delay devices 36 illustrated in FIG. 3. The embodiment of FIG. 3 thus illustrates a single reverberation channel 34 feeding multiple outputs or release channels 38. As stated above, each release channel 38 includes an amplitude modulating unit including voltage control amplifier 35 and a phase modulation unit including signal delay device 36. A plurality 39 of infrasonic modulation sources A–H independently provide random or pseudo-random variable voltages to the voltage control amplifiers 35 and signal delay devices 36 of each release channel 38 of the embodiment of FIG. 3. As stated above with regards to FIG. 1, varying the clock frequency of the signal delay device 36 results in shifting of times of release and thereby provides a phase shift increasing the perceived diffusion and animation and hence the naturalness of the reverberant field.

Figure 4:
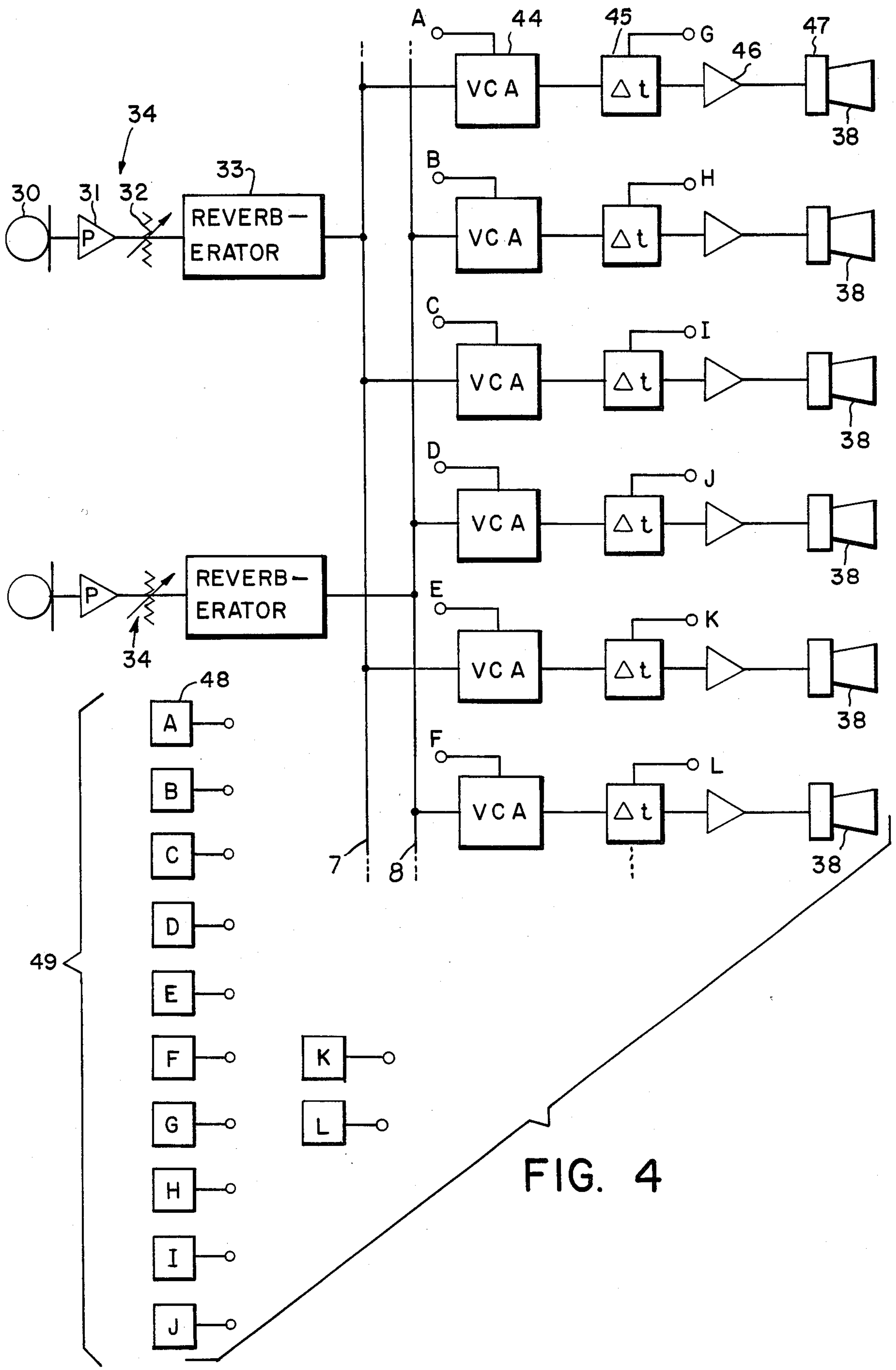
FIG. 4 is a schematic illustration of an expanded embodiment of the invention having two or more reverberators and more outputs than reverberators.

FIG. 4 illustrates a further expanded embodiment of the invention comprising two input reverberation channels 34 connected through buses 7 and 8 to a plurality of independent release channels 38, each of which includes a phase modulation unit (shown comprising a signal delay device 45 and one of a series 49 of infrasonic modulation sources G–L) and an amplitude modulation unit (including a voltage control amplifier 44 responsive to one of a series 49 of independent infrasonic modulation sources A–F). FIG. 4 thus illustrates an embodiment of the invention comprising two or more reverberators and more outputs than reverberators.

Figure 5:
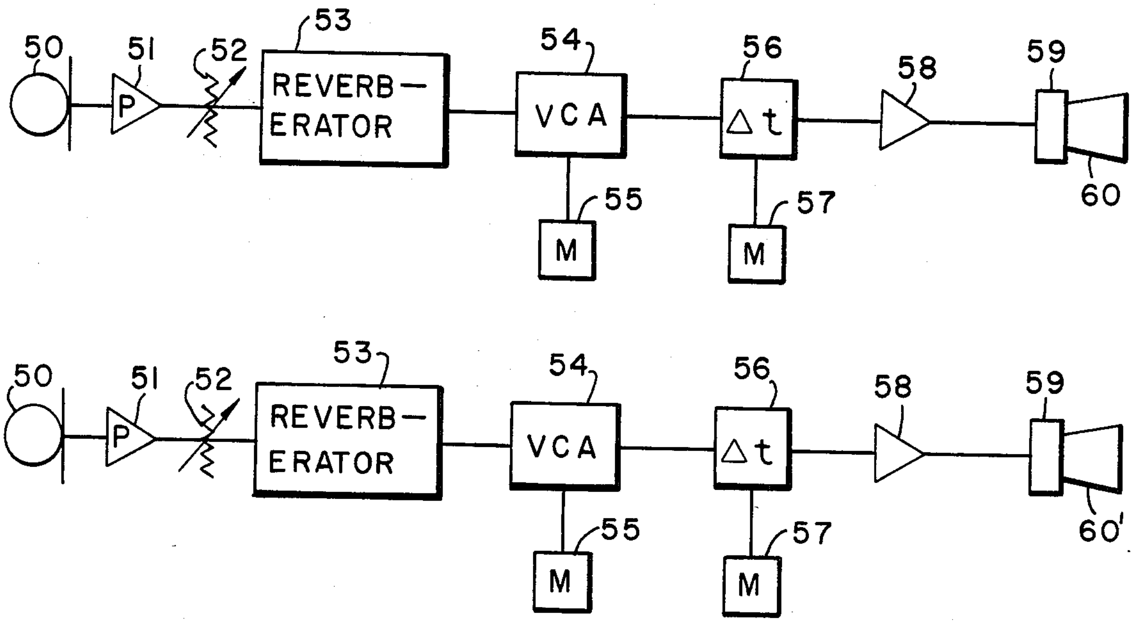
FIG. 5 is a schematic illustration of an embodiment of the invention having fully independent channels.

FIG. 5 illustrates an expanded embodiment of the invention comprising a plurality of fully independent channels 60, 60′. Each independent channel 60, 60′ in the embodiment of FIG. 5 includes a microphone 50, a pre-amplifier 51, a variable level control 52, a reverberator 53, an amplitude modulation unit including a voltage control amplifier 54 and an infrasonic modulation source 55, a phase modulation unit including a signal delay device 56 and infrasonic modulation source 57, an amplifier 58 and loudspeaker 59. Although only two independent channels are shown in FIG. 5, any plurality of such independent channels may be provided within the scope of the invention.

The foregoing embodiments of FIGS. 1–5 illustrate independent modulation of the phase of each individual release loudspeaker channel, and optionally (in FIGS. 2–5) the amplitude of each such channel, in response to an effectively random infrasonic modulating signal, independently developed for each channel. In addition to employing such modulation techniques, the release channel signals should emerge into the room at different times.

Figure 6:
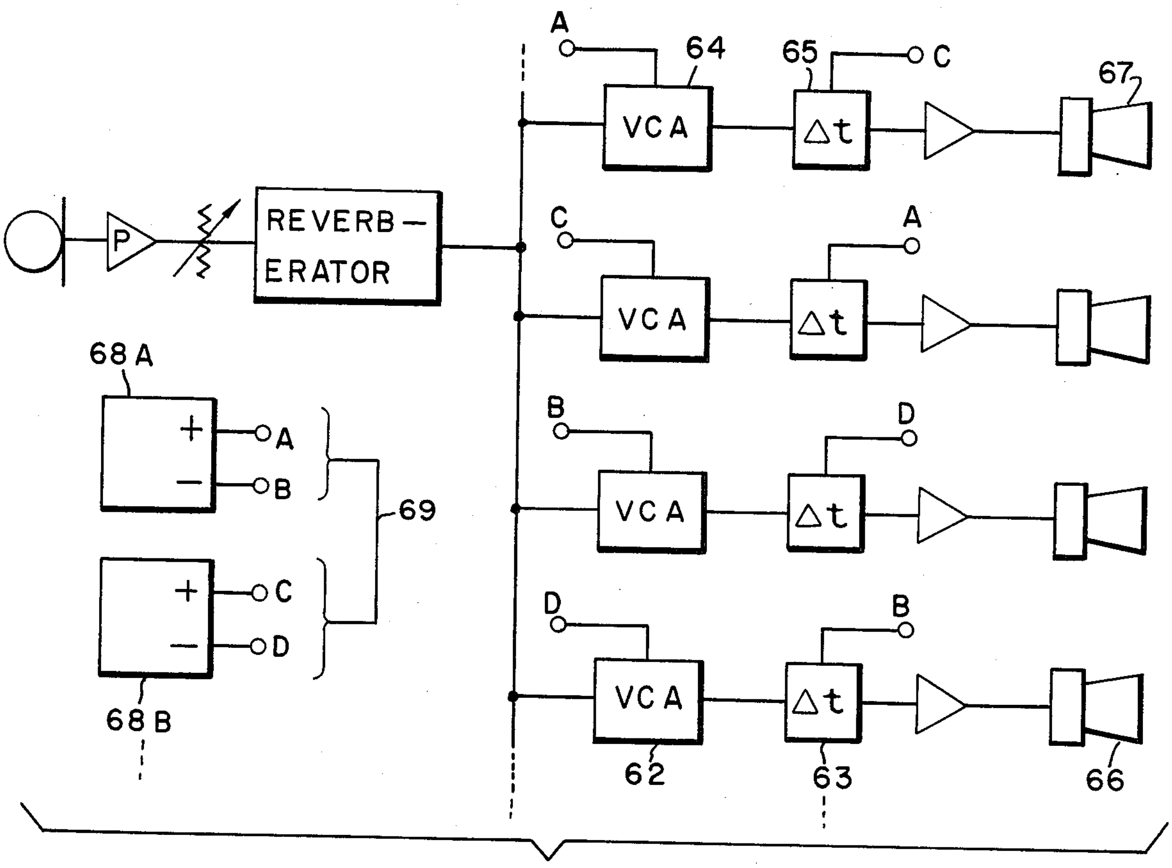
FIG. 6 is a schematic illustration of an embodiment of the invention including bipolar infrasonic modulating sources.

FIG. 6 illustrates an embodiment of the invention comprising bi-polar infrasonic modulation sources 68A, 68B characterized in that pairs of outputs 69 of modulation sources 68A, 68B are at inverse polarity (i.e., 180° out of phase). Thus, in the embodiment of FIG. 6, infrasonic modulation source A of the voltage control amplifier 64 of output channel 67 is at an inverse polarity to the infrasonic modulation source B of signal delay device 63 of output channel 66. Similarly, infrasonic modulation source D of voltage control amplifier 62 is at an inverse polarity to the infrasonic modulation source C of signal delay device 65 of output channel 67.

The amplitude of the modulating signal required to achieve proper phase modulation (i.e., no perception of frequency variance) differs through the audio band. Less modulation amplitude suffices at higher audio frequencies released by a channel. In other words, if a full-range channel is modulated sufficiently for the high-frequencies, the low frequencies are not modulated enough for fullest effectiveness. Thus, the audio pass band of a channel may be subdivided into two or more segments, each processed by its own phase modulation signal. The additional benefit of greater perceived randomness results when one frequency portion of a channel is modulated by an independent modulating signal from another frequency portion. Optimum settings vary according to the natural accoustics of the spaces where the invention is embodied and systems according to the invention may be adjusted accordingly.

Figure 7:
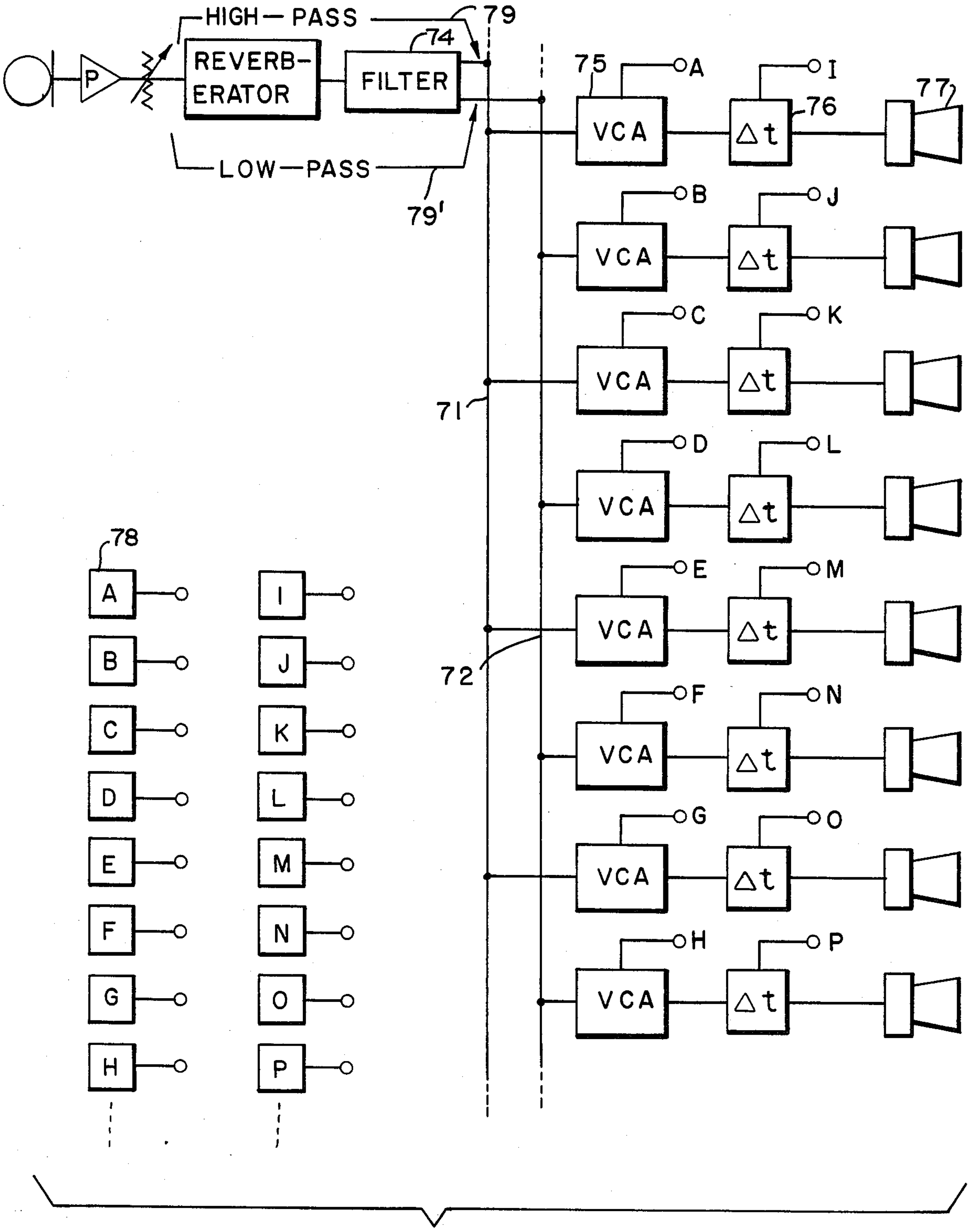
FIG. 7 is a schematic illustration of an embodiment of the invention including "high-pass" and "low-pass" filters and a plurality of release channels connected to each.

FIG. 7 illustrates a further embodiment of the invention including filter unit 74 which may provide high-pass filter 79 and a low-pass filter 79' signals through signal busses 71, 72, respectively, one each to a plurality of interleaved output channels 77 including infrasonically modulated voltage control amplifiers 75 and infrasonically modulated signal delay devices 76. Each of the voltage control amplifier 75 and signal delay devices 76 of the output channels 77 is responsive to one of a plurality 78 of individual infrasonic modulation sources A–P in the embodiment of FIG. 7. Note that in the embodiment of FIG. 7, the amplitudes of the infrasonic modulation sources J, L, N, P should be higher than the amplitudes of modulation sources I, K, M, and O. Alternatively, filters 79 or 79' may be provided in each release channel 77.

It should be noted that the strength of the invention resides primarily from the incorporation of phase modulation into the reverberation channel. Amplitude modulation can, however, convey additional naturalness in embodiments of the invention where the number of release channels is greater than 2. Therefore, amplitude modulation is not strictly necessary to the functioning of the invention but provides additional benefits if employed.

Application of phase modulation to release channels reduces the coherence of the signals heard at the listener positions, thus increasing the perceived diffusion and decreasing the localization of the release loudspeakers. The availability of a signal delay device at each release channel not only allows phase modulation of that channel but allows each channel to be set to a different time of release. If time differences beyond the ear-brain fusion time limit (the Haas effect) of about 30 milliseconds can be set for any nearest pair of speakers heard at a listener position, the ear-brain will perceive more incoherence and a "broadened" sound. As long as the onset of reverberation at the listener position is at the correct time in comparison to early and medium reflection times, the late onset of various release channels will enhance the perceived diffusion of the reverberation. Signal delays should thus be set for different times and in general, low frequencies can be released later than high frequencies.

Although the foregoing embodiments have described a method of varying the clock frequency of a signal delay device to achieve phase modulation (with the additional benefit of being able to stagger release times to further reduce coherence) this is not the only way to achieve phase modulation and should not be construed as a limitation on the phase modulation concept of the invention. Similarly, a voltage control amplifier is not the only means of achieving amplitude modulation and should not be construed as a limitation of the amplitude modulation aspect of the invention.

For example, multiple-output signal delays may be used where the delay unit is modulated by changing the frequency of its single clock. If each output is set to a different time, the phase of the outputs will change differentially relative to each other according to the relationships between time settings and component frequencies of the infrasonic modulating signal. The loudspeakers fed by a multi-output delay should be interleaved with those of another, or other, modulated delays, and should not be adjacent to each other.

Figure 8:
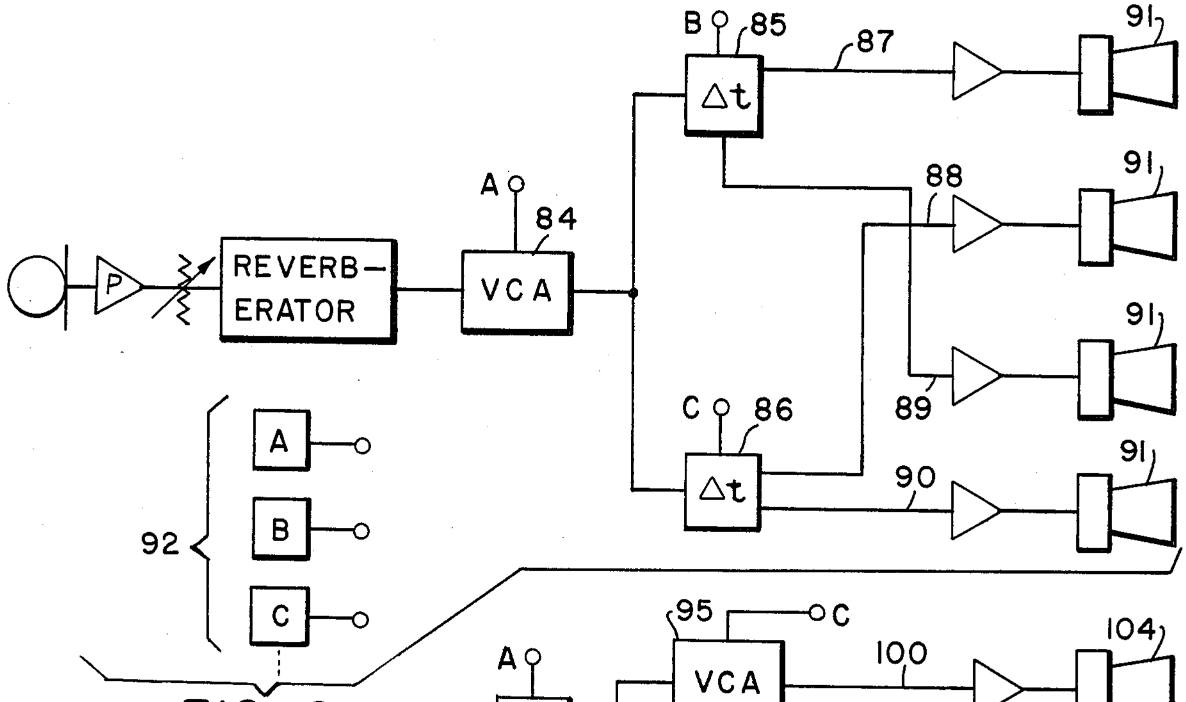
FIG. 8 is a schematic illustration of an embodiment of the invention including signal delay devices provided after amplitude modulating devices and showing the use of multiple-output signal delay devices.

FIG. 8 illustrates an embodiment of the invention including a plurality 92 of infrasonic modulation sources A–C, a voltage control amplifier 84 responsive to infrasonic modulation source A–F and two signal delay devices 85, 86 respectively responsive to independent infrasonic modulation sources B, C. Each of the delay signal devices 85, 86 includes two outputs 87, 89 and 88, 90, respectively, which feed interleaved loudspeakers 91. The embodiment of FIG. 8 illustrates signal delay devices 85, 86 having two outputs, but other embodiments may be contemplated wherein a single signal delay device may have a greater number, such as three or four, outputs.

Figure 9:
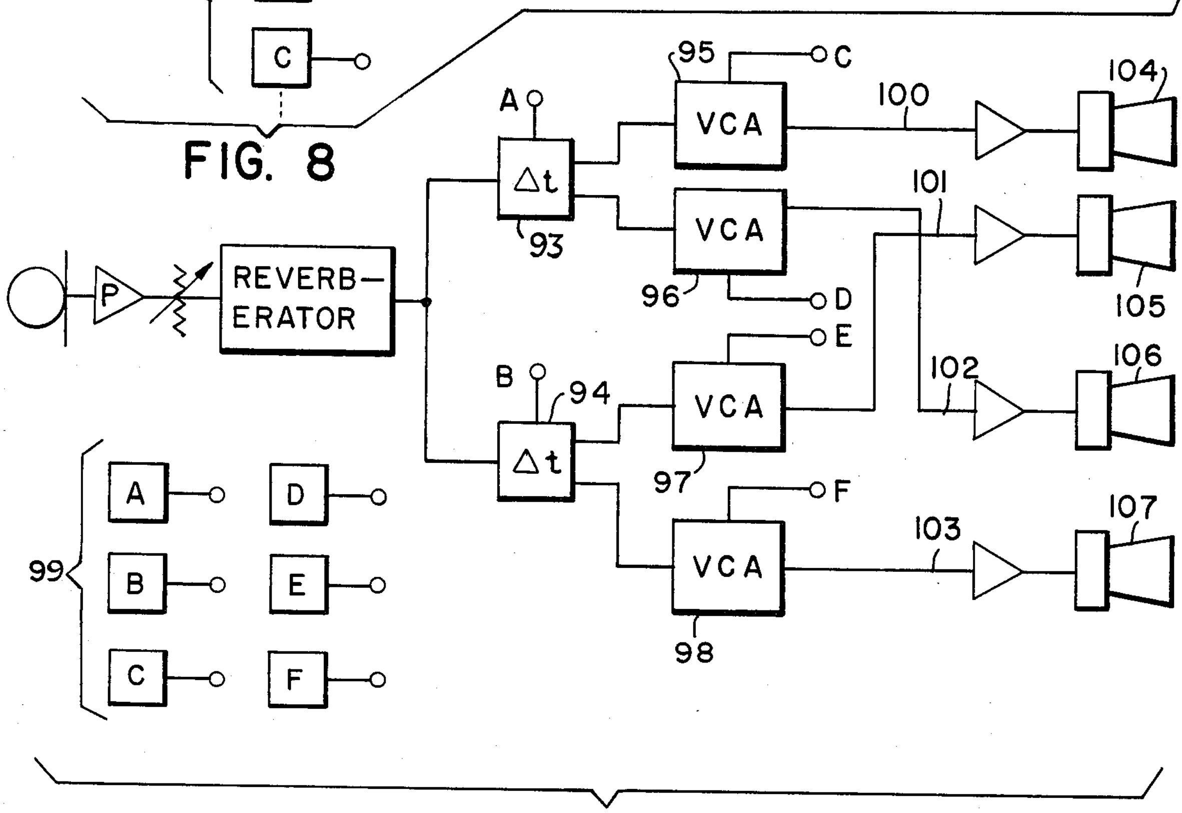
FIG. 9 is a schematic illustration of an embodiment of the invention including delay devices provided before the amplitude modulating devices and showing the use of multiple-output signal delay devices.

FIG. 9 illustrates a further embodiment of the invention comprising a plurality 99 of independent infrasonic modulation sources A–F and two signal delay devices 93, 94 having two outputs each. The number of such outputs per signal delay device may be increased. The dual outputs of signal delay 93 independently feed voltage control amplifiers 95, 96 modulated respectively by infrasonic modulation sources C, D, the outputs of the voltage control amplifiers 95, 96 being passed respectively along lines 100, 102 through individual amplifiers to interleaved loudspeakers 104, 106. Similarly, the dual outputs of signal delay device 94 are passed to voltage control amplifiers 97, 98 controlled respectively by infrasonic modulation sources E, F. The outputs of voltage control amplifiers 97, 98 are passed along lines 101, 103, respectively, through individual amplifiers to interleaved loudspeakers 105, 107.

Thus, it may be readily appreciated that the instant invention, employing independent modulation of the phase of each individual release loudspeaker channel, and optionally the amplitude of each such channel, in response to an effectively random infrasonic modulating signal, independently developed for each such channel, with the release channel signals being timed to emerge to the room at different times creates an enhanced reverberant field of greater naturalness than those electro-acoustically created in the known prior art. Phase randomness, perceived diffusion, directionlessness, and subtle animation are developed to enliven and "naturalize" the character of the electronically augmented reverberation within the room, by means of the independent modulation of the finite number of loudspeaker release channels positioned to approximate omnidirectionality. Benefits directly resulting from the invention include a much greater sense of omnidirectionality and lack of localization of release channel loudspeakers. Additionally, a reduction of susceptibility of the electronic reverberation loop to lock on to room modes is provided by the invention, and as a consequence thereof, a much flatter amplitude versus frequency response of the augmented reverberation and a greater achievable reverberant field energy level for the onset of instability are provided. Furthermore, the invention, for the first time, enables a relatively small number of release loudspeaker channels to imitate the very large number of virtual sources of a natural reverberant field. Additionally, the invention allows the introduction of subtle spatial "animation" effects which accompany the decay of the natural reverberant field, thereby greatly increasing the sense of naturalness of the instant electro-acoustical system.

It has not heretofore been known to provide such a multi-channel independent modulation scheme to a system for electronically enhancing the reverberation in a room or space.

The invention, although described in great detail above, may be applied in a large variety of unspecified configurations, sizes of systems, and numbers of both reverberation channels and loudspeaker release channels. Further, although the above-described embodiments involve modulating the clock frequency of digital or analog delay lines and modulating the control input of voltage control amplifiers, many techniques for providing phase modulation and amplitude modulation are known and the invention is clearly not limited to any particular modulation or reverberation devices.

Thus, although the invention has been described in detail above with regards to various specific embodiments, the invention should not be limited to the specific embodiments disclosed herein, but rather should be interpreted only in accordance with the spirit of the invention and scope of the claims which follow.

I claim:

1. An apparatus for increasing perceived reverberant field diffusion, comprising:

reverberation means for delivering a reverberation imparted signal into a sound signal release channel;

phase modulating means within said release channel for randomly modulating the phase of the reverberated signal; and loudspeaker release means adapted within said release channel for receiving the reverberated, phase modulated sound signal and for releasing said signal.

2. An apparatus for increasing perceived reverberant field diffusion, as recited in claim 1, wherein said phase modulating means comprises phase altering means for altering the phase of a signal passing therethrough and a first infrasonic modulating signal generating means for generating an infrasonic modulating control signal for controlling the operation of the phase altering means.

3. An apparatus for increasing perceived reverberant field diffusion, as recited in claim 1, further comprising:

amplitude modulating means adapted within said release channel for modulating the amplitude of the reverberated signal.

4. An apparatus for increasing perceived reverberant field diffusion, as recited in claim 2, further comprising:

amplitude modulating means adapted within said release channel for modulating the amplitude of the reverberated signal.

5. An apparatus for increasing perceived reverberant field diffusion, as recited in claim 4, wherein said amplitude modulating means comprises amplitude altering means for altering the amplitude of a signal passing therethrough and a second infrasonic modulating signal generating means for generating an infrasonic modulating control signal for controlling the operation of said amplitude altering means.

6. An apparatus for increasing perceived reverberant field diffusion, as recited in claim 5, wherein said first and second infrasonic modulating signal generating means are independent of each other.

7. An apparatus for increasing perceived reverberant field diffusion, as recited in claim 6, wherein said first and second infrasonic modulating signal generating means are each adapted to generate signals having at least two frequencies being present within the range of about 5 seconds/cycle to about 5 cycles/second.

8. An apparatus for increasing perceived reverberant field diffusion, as recited in claim 6, wherein said phase modulating means functions by modulating the clock frequency of a delay line.

9. An apparatus for increasing perceived reverberant field diffusion, as recited in claim 6, wherein said amplitude modulating means functions by modulating the control input of a voltage control amplifier.

10. An electro-acoustical system, comprising a plurality of independent channels each of which comprises an apparatus according to claim 2.

11. An electro-acoustical system, comprising a plurality of independent channels each of which comprises an apparatus according to claim 5.

12. An electro-acoustical system, comprising a plurality of independent channels each of which comprises an apparatus according to claim 6.

13. An apparatus for increasing perceived reverberant field diffusion, comprising a reverberation channel including a sound signal inputting means and a reverberation means for imparting reverberation to said sound signal, and a plurality of release channels responsive via bus means to said reverberation channel, each of said release channels including an independent phase modulating means adapted within said release channel for randomly modulating the phase of the reverberated signal and a loudspeaker means adapted with each said release channel to receive and release a reverberated sound signal, thereby producing a perceived random relationship among the outputs of said loudspeaker means of said plurality of release channels.

14. An apparatus for increasing perceived reverberant field diffusion, as recited in claim 13, wherein each of said phase modulating means of said plurality of release channels comprises phase altering means for altering the phase of a signal passing therethrough and an infrasonic modulating signal generating means for generating an infrasonic modulating control signal for controlling the operation of the phase altering means independently of the infrasonic modulating signal generating means of the others of said plurality of release channels.

15. An apparatus for increasing perceived reverberant field diffusion, as recited in claim 14, wherein each of said release channels further comprises an independent amplitude modulating means adapted within said release channel for modulating the amplitude of the reverberated signal.

16. An apparatus for increasing perceived reverberant field diffusion, as recited in claim 15, wherein each of said amplitude modulating means comprise amplitude altering means for altering the amplitude of a signal passing therethrough and an independent infrasonic modulating control signal for controlling the operation of said amplitude altering means.

17. An electro-acoustical system comprising a plurality of the apparatuses recited in claim 14.

18. An electro-acoustical system, comprising a plurality of the apparatuses recited in claim 16.

19. An apparatus for increasing perceived reverberant field diffusion, as recited in claim 13, wherein at least two independent modulating sources are provided, each of said modulating sources being equipped with non-inverting and inverting outputs such that a given modulating signal is transmitted from the outputs thereof respectively substantially 180° out of phase.

20. An apparatus for increasing perceived reverberant field diffusion, as recited in claim 15, wherein at least two independent modulating sources are provided, each of said modulating sources being equipped with non-inverting and inverting outputs such that a given modulating signal is transmitted from the outputs thereof respectively substantially 180° out of phase.

21. An apparatus for increasing perceived reverberant field diffusion, as recited in claim 20, wherein one of said at least two modulating sources modulates the phase of one release channel and the amplitude of at least one of said plurality of release channels.

22. An apparatus as recited in claim 13, wherein said reverberation channel includes a high-pass filter and a low-pass filter and wherein said bus means includes first bus means for distributing signals from said high-pass filter to first ones of said plurality of release channels and second bus means for distributing signals from said low-pass filter to second different ones of said plurality of release channels.

23. An apparatus as recited in claim 15, wherein said reverberation channel includes a high-pass filter and a low-pass filter and wherein said bus means includes first bus means for distributing signals from said high-pass filter to first ones of said plurality of release channels and second bus means for distributing signals from said low-pass filter to second different ones of said plurality of release channels.

24. An apparatus for increasing perceived reverberant field diffusion, comprising reverberation means delivering a reverberation imparted sound signal into a sound signal channel;

phase modulating means within said channel, modulating the phase of the sound signals passing there through, said phase modulating means comprising signal delay means having a plurality of outputs and a clock frequency, an infrasonic modulating source substantially randomly having time settings and component frequencies for substantially randomly modulating the clock frequency of the delay means, each of said outputs being set to a different time such that the phase of the outputs will change differentially relative to each other according to the relationship between said time settings and component frequencies of the infrasonic modulating source; and a plurality of loudspeaker release means, each of said loudspeaker release means being coupled to one of the plurality of outputs of said phase modulating means for releasing said sound signals to produce a perceived random relationship among said outputs for releasing said sound signals.

25. An apparatus for increasing perceived reverberant field diffusion, as recited in claim 24, wherein a plurality of said phase modulating means are provided, further comprising bus means for distributing modulating signals to said plurality of phase modulating means.

26. An apparatus for increasing perceived reverberant field diffusion, as recited in claim 25, further comprising amplitude modulating means provided within said channel for modulating the amplitude of the sound signals.

27. A method for increasing perceived reverberant field diffusion in an electro-acoustical reverberance enhancement system, said system having reverberation imparting means, a loudspeaker release channel receiving a reverberated signal from said imparting means, for releasing sound signals, and a loudspeaker responsive to said release channel, comprising the step of independently, randomly modulating the phase of the reverberated signals delivered to said release channel with infrasonic modulating means prior to releasing said sound signals from said loudspeaker.

28. The method of claim 27, further comprising the step of independently modulating the amplitude of the sound signals of said release channel with infrasonic modulating means prior to releasing said sound signals from said loudspeaker.

* * * * *